United States Patent
Lee et al.

(10) Patent No.: US 11,894,689 B2
(45) Date of Patent: Feb. 6, 2024

(54) POWER SUPPLY SYSTEM AND VIBRATING PROCESSING APPARATUS

(71) Applicant: ACROW MACHINERY MANUFACTURING CO., LTD., Taichung (TW)

(72) Inventors: Chao-Ching Lee, Taichung (TW); Chia-Hsin Lai, Taichung (TW); Yung-Chun Wu, Huwei Township (TW)

(73) Assignee: ACROW MACHINERY MANUFACTURING CO., LTD., Taichung (TW)

( * ) Notice: Subject to any disclaimer, the term of this patent is extended or adjusted under 35 U.S.C. 154(b) by 398 days.

(21) Appl. No.: 17/181,031

(22) Filed: Feb. 22, 2021

(65) Prior Publication Data

US 2021/0351623 A1  Nov. 11, 2021

(30) Foreign Application Priority Data

May 6, 2020  (TW) .................................. 109205460

(51) Int. Cl.
*H02J 50/12* (2016.01)
*H02M 3/155* (2006.01)
*H10N 30/20* (2023.01)
*H10N 30/80* (2023.01)

(52) U.S. Cl.
CPC ............. *H02J 50/12* (2016.02); *H02M 3/155* (2013.01); *H10N 30/20* (2023.02); *H10N 30/802* (2023.02)

(58) Field of Classification Search
CPC ....... H02J 50/12; Y02B 70/10; H02M 3/1582; H02M 3/155; H02M 1/007; H02M 1/0058; H02M 1/4208; H02M 7/4815; H02M 7/53803; H10N 30/20; H10N 30/802

See application file for complete search history.

(56) References Cited

U.S. PATENT DOCUMENTS 10,090,884 B2 * 10/2018 Ettes ..................... H04B 5/0093
10,279,396 B2    5/2019 Chen et al.
10,570,985 B2    2/2020 Chen et al.
(Continued)

FOREIGN PATENT DOCUMENTS

| CN | 103920635 B | 3/2016 |
| TW | I519381 B | 2/2016 |
| TW | I566062 B | 1/2017 |

*Primary Examiner* — Emily P Pham
(74) *Attorney, Agent, or Firm* — Alan D. Kamrath; Karin L. Williams; Mayer & Williams PC

(57) ABSTRACT

The power supply system of the present invention includes a wireless electricity transmitter and a wireless electricity receiver transmitting electricity by electromagnetic coupling. The wireless electricity receiver is further connected to a vibrator of a vibrating processing apparatus to transmit electricity thereto. The wireless electricity transmitter has a controller to monitor the operating voltage and the operating current of the transmitter, and alternates the oscillation frequency of the operating voltage according to the phase difference between the operating voltage and the operating current. Thereby, the oscillation frequency may approach the resonance frequency of the vibrator in order to improve the efficiency of electricity transmission. Also, the distance between the wireless electricity transmitter and the wireless electricity receiver can be increased.

14 Claims, 6 Drawing Sheets

(56) References Cited

U.S. PATENT DOCUMENTS

| | | | |
|---|---|---|---|
| 10,727,697 B2* | 7/2020 | Pavlovsky | H01F 38/14 |
| 2017/0126281 A1* | 5/2017 | Cook | H02J 50/12 |
| 2018/0239999 A1* | 8/2018 | Gayton | G06K 7/10099 |

* cited by examiner

POWER SUPPLY SYSTEM AND VIBRATING PROCESSING APPARATUS

FIELD OF THE INVENTION

The present disclosure relates to a vibrating processing apparatus such as an ultrasonic processing tool, which is provided with electricity by the wireless electricity transmitter to vibrate to process.

BACKGROUND OF THE INVENTION

A vibrating processing apparatus cuts workpieces by its vibrating tool. It is advantageous in the processing of materials in high hardness, in high brittleness, or with flexibility, as disclosed in patents TW 1671159 and TW 1666087.

In the patents mentioned above, in order to process by milling and vibrating, the processing tool is installed on a rotatable spindle, and the electricity is transmitted to the spindle or the processing tool by coil induction. To increase the efficiency of coil induction, the primary coil outside the spindle and the secondary coil on the spindle or the processing tool have to be arranged near each other. Practically, the distance between the primary coil and the secondary coil has to be smaller than a few micrometers. Thus, the operation and the mechanical design of the spindle and the processing tool are limited.

To reduce the distance between the primary coil and the secondary coil, coils having identical resonance frequency is a possible solution. The resonance between the primary coil and the secondary coil allows the distance therebetween to increase. However, the resonance frequency of the primary coil, the secondary coil, and the vibrator is unstable because of the rotation of the spindle, the loading of processing, and the temperature.

The present invention is, therefore, arisen to obviate or at least mitigate the above mentioned disadvantages.

SUMMARY OF THE INVENTION

One of the objects of the present invention is to provide a power supply system to supply electricity to vibrating processing apparatus in order to increase the flexibility of design by mitigating the limitation of the distance between the primary coil and the secondary coil.

To achieve the above and other objects, the power supply system adapted for supplying electricity to a vibratory processing apparatus having a vibrator wherein the vibrator has a resonance frequency and is triggered to vibrate by electricity includes a wireless electricity receiver and a wireless electricity transmitter.

The wireless electricity receiver is adapted for connecting to the vibrator. The wireless electricity receiver has a receiver resonance frequency which is identical to the resonance frequency of the vibrator. The wireless electricity transmitter includes a transmitter, a frequency converter, and a controller. The transmitter is adapted for transmitting electricity to the wireless electricity receiver. The transmitter has a transmitter resonance frequency. The frequency converter is connected to the transmitter and is triggered by electricity to output an operating voltage to the transmitter. The operating voltage has an oscillation frequency. An operating current is generated when the operating voltage is exerted on the transmitter. The controller is connected to the frequency converter. The controller controls and adjusts the oscillation frequency according to a phase of the operating voltage and a phase of the operating current.

In some embodiments, the transmitter resonance frequency is identical to the receiver resonance frequency. Preferably, the frequency converter is a half bridge inverter.

In some embodiments, the oscillation frequency is adjusted by the controller to minimize the phase difference between the operating voltage and the operating current or to make the phase difference approach a predetermined value. Preferably, the controller makes the phase difference to become zero.

In some embodiments, the wireless electricity transmitter further includes a DC-to-DC converter. The DC-to-DC converter is connected to the frequency converter to be driven by electricity to output a driving voltage to the frequency converter. The controller is connected to the DC-to-DC converter to alternate the driving voltage.

The present invention also provides vibrating processing apparatus includes the power supply system mentioned above, the vibrator, and a processing tool. The wireless electricity receiver is connected the vibrator. The vibrator is disposed on the processing tool. The vibrator is electrically triggered by the wireless electricity receiver in order to make at least a part of the processing tool vibrate.

In some embodiments, the vibrator is a piezo element.

In some embodiments, a capacitance of the transmitter is defined as C1. An inductance of the transmitter is defined as L1. A capacitance of the wireless electricity receiver is defined as C2. An inductance of the wireless electricity receiver is defined as L2. The resonance frequency of the vibrator is defined as fr. And, $$f_r = \frac{1}{2\pi\sqrt{L_1 C_1}} = \frac{1}{2\pi\sqrt{L_2 C_2}}.$$

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

The present disclosure can be more fully understood by reading the following detailed description of the embodiment, with reference made to the accompanying drawings as follows.

DETAILED DESCRIPTION OF THE PREFERRED EMBODIMENTS

Figure 1:
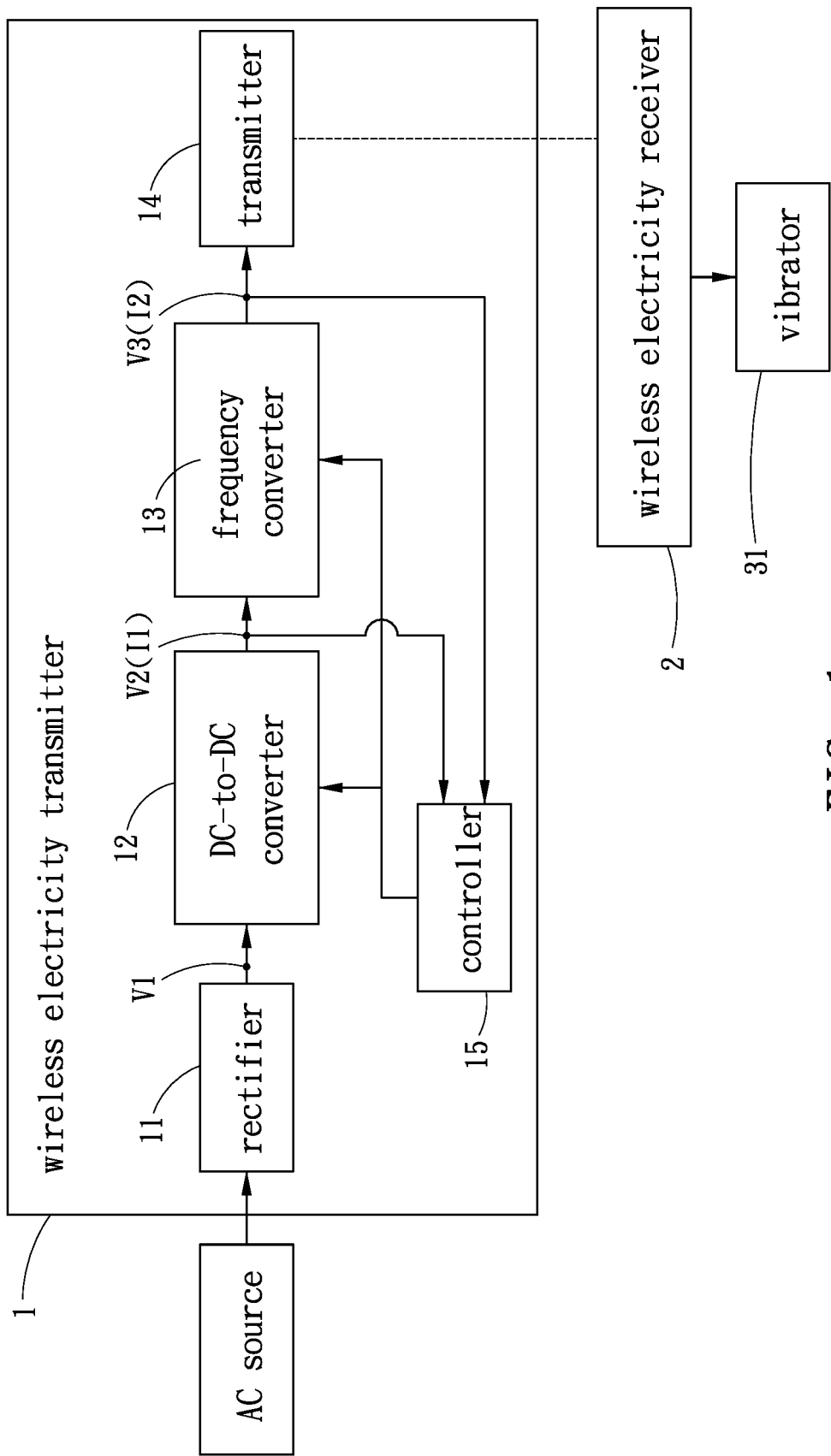
FIG. 1 is an illustration showing a power supply system of the present invention.
Figure 2:
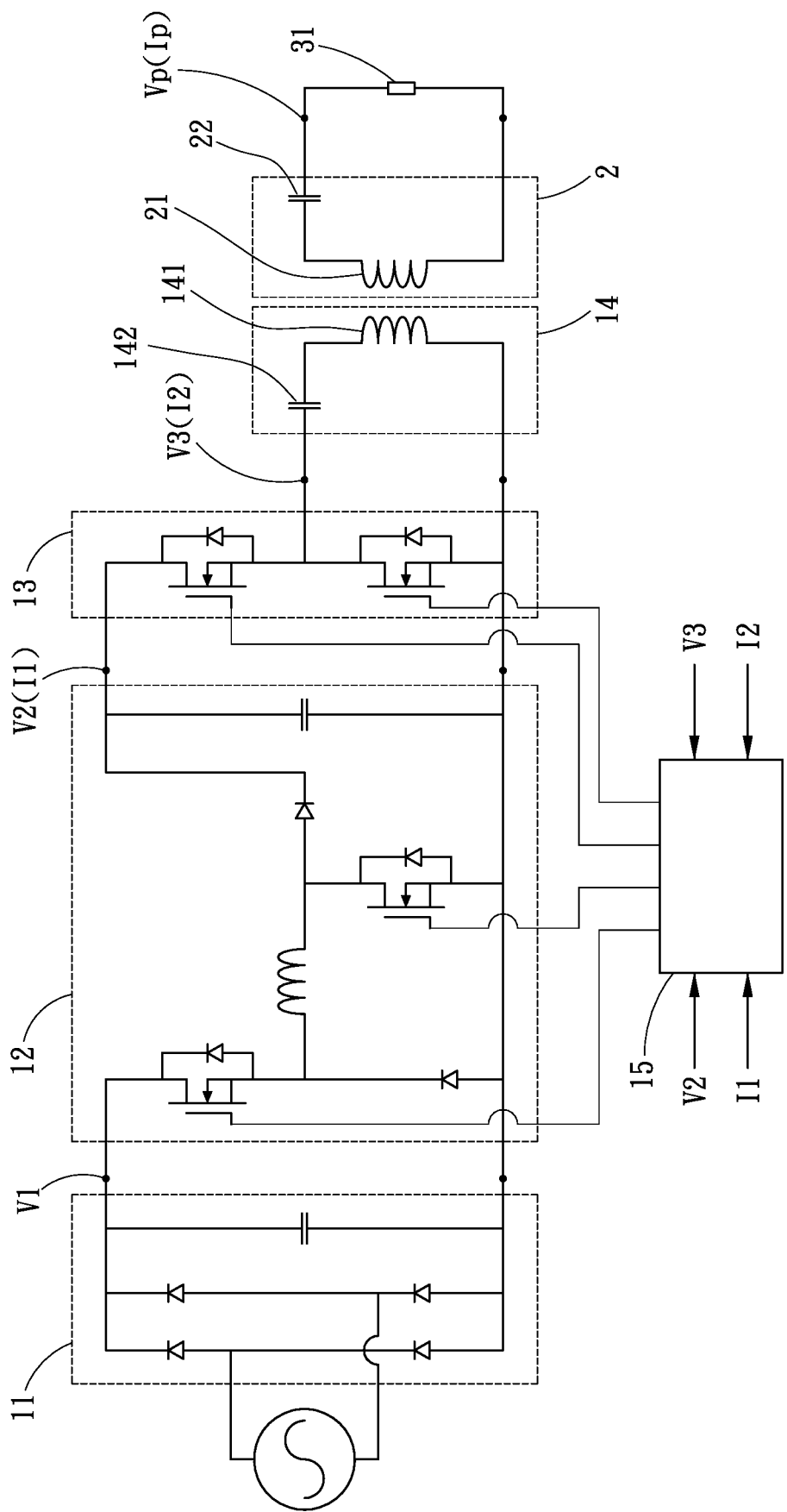
FIG. 2 is a circuit diagram of a power supply system of the present invention.

Please refer to FIG. 1 and FIG. 2, the present invention provides a power supply system adapted for being disposed on a vibrating processing apparatus to supply electricity to the vibrator therein. The vibrator has a resonance frequency.

The power supply system includes a wireless electricity transmitter 1 and a wireless electricity receiver 2.

The wireless electricity transmitter 1 includes a rectifier 11, a DC-to-DC converter 12, a frequency converter 13, a transmitter 14, and a controller 15.

The rectifier 11 can be abridge rectifier to receive AC input and to output DC V1.

The DC-to-DC converter 12 can be buck-boost converter and is connected to the rectifier 11 to be electrically triggered by the rectifier 11. In other possible embodiments, half-bridge converter, bridge converter, flyback converter, or other types of converter can be used as the DC-to-DC converter.

The frequency converter 13 can be an inverter and is connected to the DC-to-DC converter 12 to be triggered by a driving voltage V2 output by the DC-to-DC converter 12 in order to output an operating voltage V3 with periodic oscillation. The operating voltage V3 has an oscillation frequency. Specifically, the frequency converter 13 is a half-bridge inverter and outputs the operating voltage V3 with square waveform by switching on and off. However, full-bridge inverter or other types of inverter can be used too.

The transmitter 14 is connected to the frequency converter 13 and outputs an operating current 12 when triggered by the operating voltage V3. The transmitter 14 is electromagnetically coupled with the wireless electricity receiver 2 to transmit electricity to the wireless electricity receiver 2. Specifically, the transmitter 14 includes a transmitter coil 141 and a first matching circuit 142. The first matching circuit 142 may be one or several capacitors, connected to the transmitter coil 141 in a series circuit and/or a parallel circuit so that the transmitter 14 has a capacitance C1 and an inductance L1. The inductance L1 can be approached from the inductance of the transmitter coil 141, and the capacitance C1 can be approached from capacitance of the first matching circuit 142. The transmitter 14 has a transmitter resonance frequency fc1 which can be calculated from the following equation.

$$f_{c1} = \frac{1}{2\pi\sqrt{L_1 C_1}}$$

The controller 15 can be System-on-a-Chip (SoC) to be connected to the DC-to-DC converter 12, the frequency converter 13, and the transmitter 14 and monitors the effective values and the phases of the operating voltage V3 and the operating current 12 output to the transmitter 14 by programming. The controller 15 further controls the DC-to-DC converter 12 and the frequency converter 13 according to the operating voltage V3 and the operating current 12 so as to adjust the phases of the operating voltage V3 and the operating current 12 and to control the operating voltage V3 and the operating current 12 in a desired range which is entered into the controller 15 in advance or/and by commands. Specifically, in view of the effective value of the operating voltage V3 and the operating current 12, when the operating voltage V3 is too high or too low, the controller 15 controls the DC-to-DC converter 12 to reduce or step up the voltage in order to adjust the driving voltage V2. Thereby the operating voltage V3 is stabilized in the desired range. When the operating current 12 is too high or too low, the controller 15 controls the DC-to-DC converter 12 to reduce or step up the voltage in order to adjust the driving voltage V2, and the operating current 12 is alternated by the operating voltage V3. Thereby the operating current 12 is kept in the desired range. In view of the phases of the operating voltage V3 and the operating current 12, when the phase difference between the operating voltage V3 and the operating current 12 is zero or a predetermined value set up in the controller 15 in advance, it means that the oscillation frequency of the operating voltage V3 is identical to the resonance frequency of the vibrator or satisfies a specific relationship with the resonance frequency of the vibrator, so the controller 15 maintains the oscillation frequency of the frequency converter 13 at the operating voltage V3. When the phase difference is not zero or deviates from a predetermined value, it means that the oscillation frequency of the operating voltage V3 deviates from the resonance frequency of the vibrator or a specific value, so the controller 15 controls the frequency converter 13 to alternate the oscillation frequency of the operating voltage V3 until the phase difference between the operating voltage V3 and the operating current 12 reaches a minimum, zero, or a predetermined value.

Figure 3:
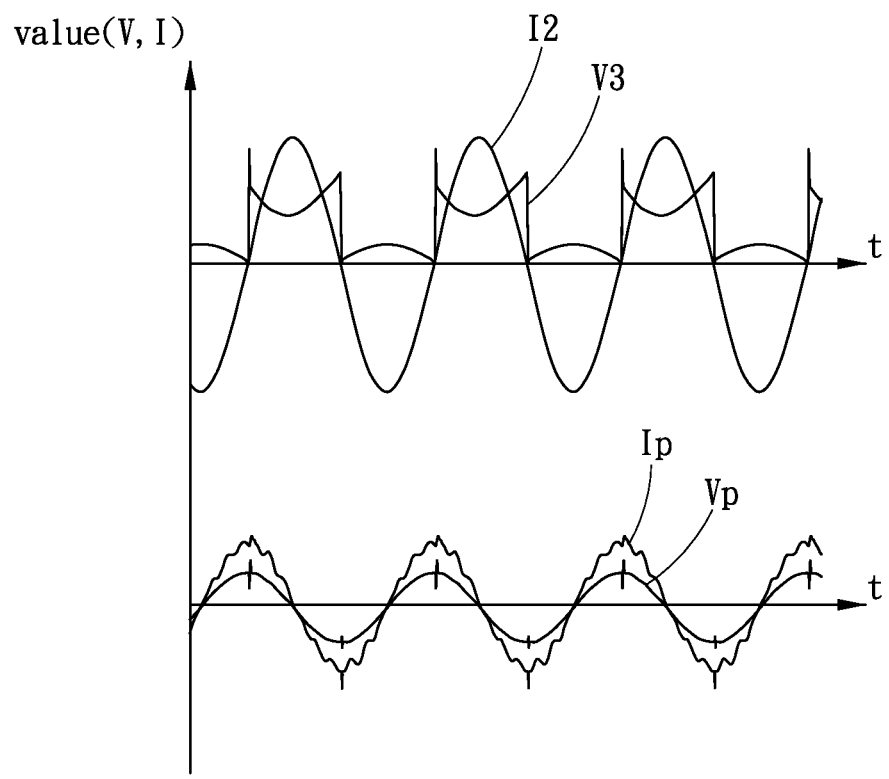
FIG. 3 to FIG. 5 are waveforms of an operating voltage, an operating current, and a voltage and a current of a vibrator of a power supply system of the present invention.
Figure 4:
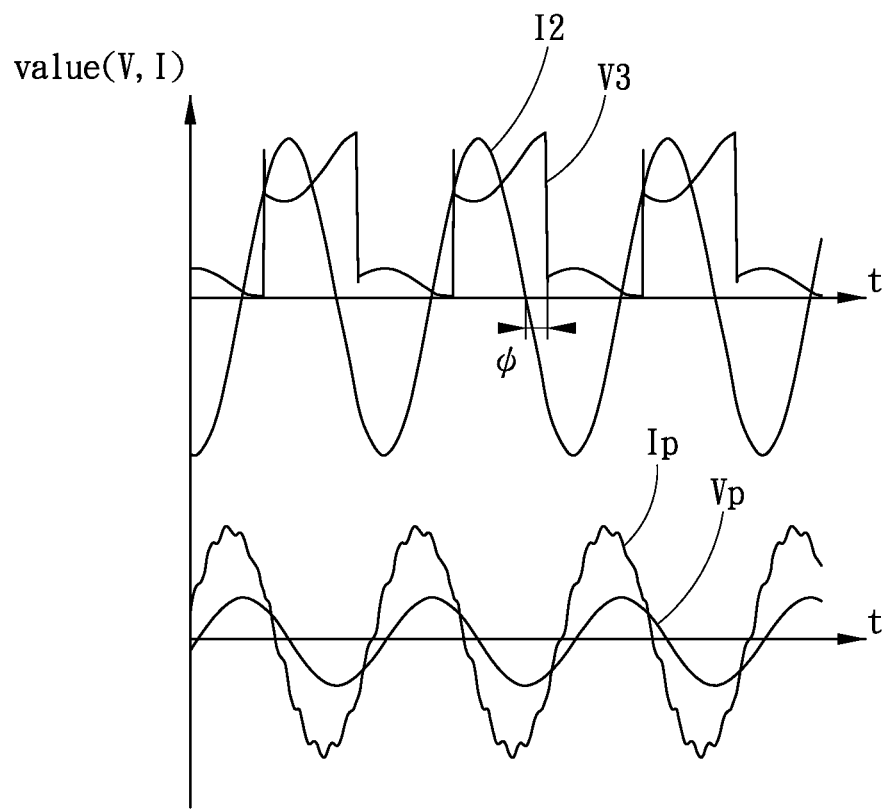
Figure 5:
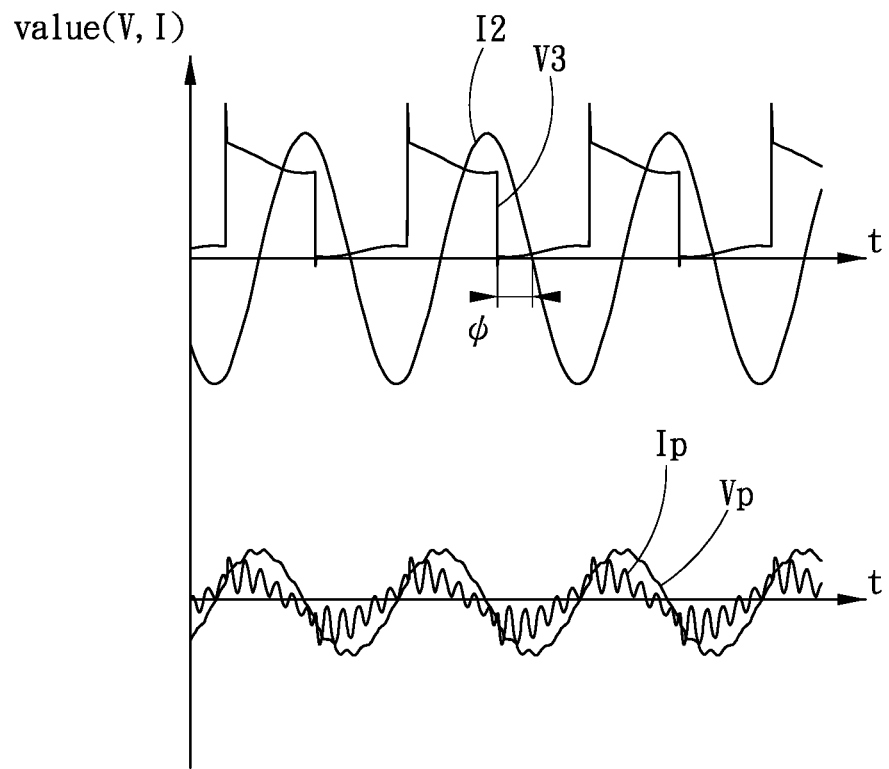

The relationship among the phase difference between the operating voltage V3 and the operating current 12, the oscillation frequency of the operating voltage, and the resonance frequency of the vibrator can be known by analyzing the operating voltage V3, the operating current 12, the voltage Vp of the vibrator, and the current Ip of the vibrator. In a normal experimental environment, the oscillation frequency of the operating voltage can be set up as the resonance frequency of the vibrator in advance, and the waveforms of the operating voltage V3, the operating current 12, the voltage Vp of the vibrator, and the current Ip of the vibrator are shown in FIG. 3. It is noted that the phases of the operating voltage and the operating current are almost identical and have a phase difference approaching zero. Also, the phases of the voltage and the current of the vibrator are almost identical. Please refer to FIG. 4 when reducing the oscillation frequency of the operating voltage or FIG. 5 when stepping up the oscillation frequency of the operating voltage, phase differences φ are formed between the operating voltage and the operating current, and also between the voltage and the current of the vibrator. That is, when the phases of the operating voltage and the operating current approach identical, the oscillation frequency of the operating voltage also approaches the resonance frequency of the vibrator.

It is noted that the vibrator can have a plurality of resonance frequencies, and the controller can switch the oscillation frequency of the operating voltage among the plurality of resonance frequencies automatically or passively. For example, the vibrator can have a plurality of resonance frequencies including 25 kHz, 50 kHz, and 75 kHz. The controller outputs the operating voltage having the oscillation frequency of 25 kHz, and adjusts the oscillation frequency in a range around 25 kHz. The controller can switch the resonance frequency to another one, such as 50 kHz, to trigger the vibrator.

The wireless electricity receiver 2 has a structure similar to the transmitter 14 and electromagnetically coupled to the transmitter coil 141 in order to receive electricity from the transmitter 14. Specifically, the wireless electricity receiver 2 includes a receiver coil 21 and a second matching circuit 22. The second matching circuit 22 may be one or several capacitors, connected to the receiver coil 21 in a series circuit and/or a parallel circuit so that the wireless electricity receiver 2 has a capacitance C2 and an inductance L2. The receiver coil 21 is electromagnetically coupled to the transmitter coil 141. The inductance L2 can be approached from the inductance of the receiver coil 21, and the capacitance C2 can be approached from the capacitance of the second matching circuit 22. The wireless electricity receiver 2 has a receiver resonance frequency fc2 which satisfies the equation below. The wireless electricity receiver 2 and the transmitter 14 make the receiver resonance frequency fc2 and the transmitter resonance frequency fc1 identical by configuration so as to improve the efficiency of electromagnetically coupling and electricity transmission between the wireless electricity receiver 2 and the transmitter 14.

$$f_{c2} = \frac{1}{2\pi\sqrt{L_2 C_2}}$$

Figure 6:
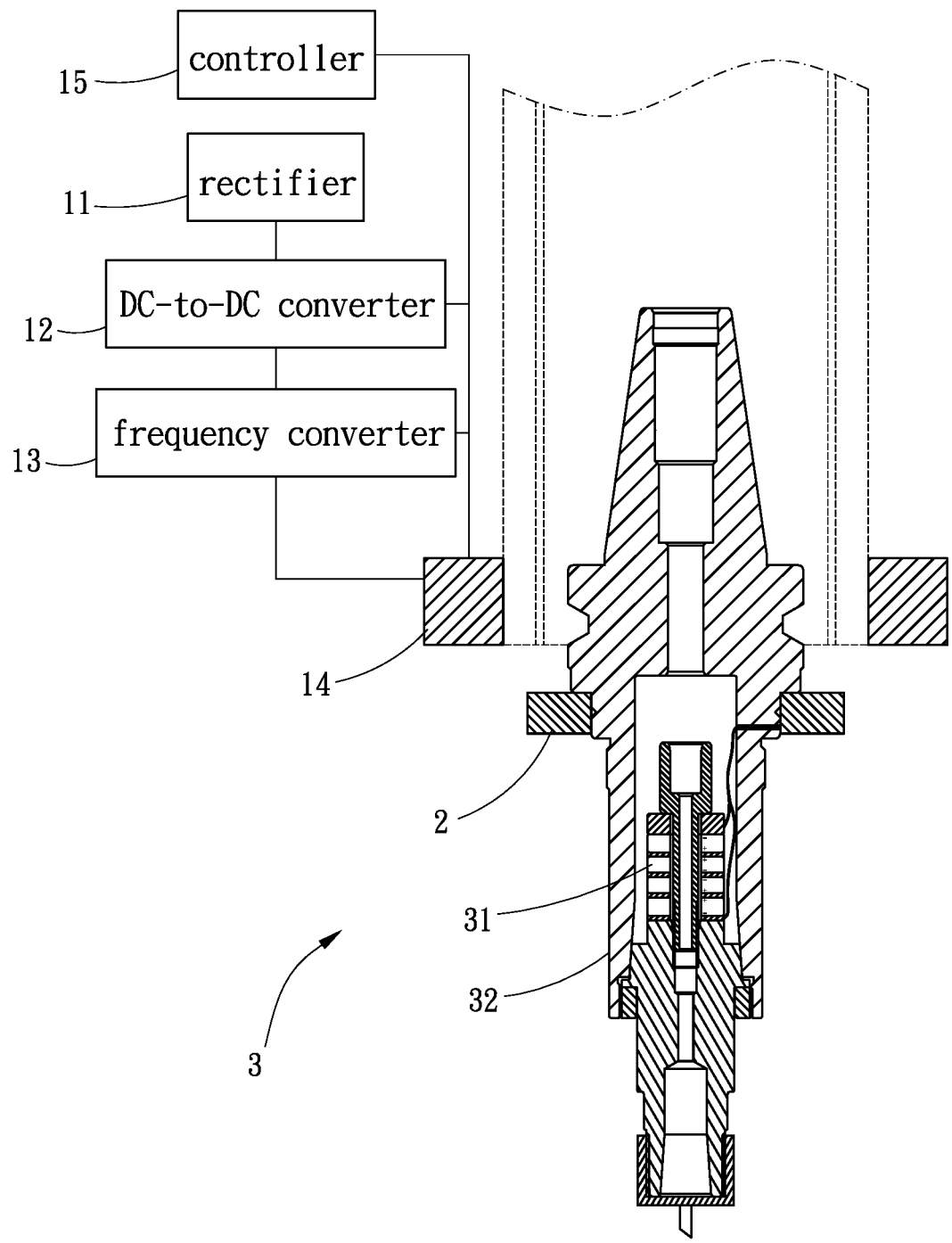
FIG. 6 is an illustration showing a vibrating processing apparatus of the present invention.

The power supply system mentioned above can be used in a vibrating processing apparatus. Please refer to FIG. 6, the vibrating processing apparatus 3 includes a vibrator 31 and a processing tool 32.

The vibrator 31 is connected to the wireless electricity receiver 2. Specifically, the vibrator 31 includes one or several piezoelectric elements to be triggered by the electricity supplied by the wireless electricity receiver 2 in order to vibrate due to the oscillation of voltage and current. The vibrator 31 has a resonance frequency and has a maximum amplitude when receiving the current and voltage oscillating in the resonance frequency. Preferably, the resonance frequency is identical to the receiver resonance frequency fc2 and the transmitter resonance frequency fc1 and satisfies the following equation.

$$f_r = \frac{1}{2\pi\sqrt{L_1 C_1}} = \frac{1}{2\pi\sqrt{L_2 C_2}}$$

The processing tool 32 can be a tool holder, a tool shank, a cutting tool, or the assembly thereof to accommodate milling machine, cutting machine, or other types of processing machine. The vibrator 31 is disposed on the processing tool 32 to make the terminal end or the whole piece of the processing tool 32 to vibrate for processing.

Practically, the wireless electricity transmitter can be connected to a normal AC source. AC is converted to DC, and is converted to DC in a desired voltage by the DC-to-DC converter. And then, the DC is converted to the operating voltage having the desired oscillation frequency by the frequency converter, and the operating voltage is applied to the transmitter. The transmitter and the wireless electricity receiver transmit electricity by electromagnetically coupling, and the electricity is further transmitted to the vibrator.

Because the transmitter and the wireless electricity receiver transmit electricity by electromagnetically coupling and the transmitter has a resonance frequency identical to that of the wireless electricity receiver, the distance between the transmitter coil and the receiver coil can be longer so that the limitation to the positions of the coils is mitigated. Thus, the design of the mechanism becomes unrestricted.

Besides, the controller can monitor the phases of the operating voltage and the operating current of the transmitter, and adjusts the oscillation frequency output by the frequency converter according to the phase difference in order to minimize the phase difference between the operating voltage and the operating current. Thereby, the deviation of the oscillation frequency of the vibrator can be monitored by the oscillation frequency of the operating voltage so as to keep triggering the vibrator in the operating voltage having the desired resonance frequency in order to improve the efficiency of electricity transmission.

In the frequency tracking mentioned above, the controller monitors only the operating voltage and the operating current of the wireless electricity transmitter instead of the wireless electricity receiver or the vibrator. Thus, signal from the processing tool is not needed, and the communication device between the wireless electricity transmitter and the wireless electricity receiver is not necessary anymore. Therefore, the mechanism and the circuit can be simplified.

In the embodiments above, the wireless electricity transmitter has the rectifier and the DC-to-DC converter, so DC having voltage in a wider range can be used as the power source. However, the rectifier or/and the DC-to-DC converter can be omitted the power source satisfying the needs.

In conclusion, the power supply system of the present invention can supply electricity to the vibrator in the vibrating processing apparatus by resonance. In addition, the resonance frequency of the vibrator can be tracked. Thus, the limitation of structure is mitigated, and the efficiency of electricity transmission is improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power supply system for supplying electricity to a vibratory processing apparatus, having a vibrator, the vibrator having a resonance frequency, the vibrator being triggered to vibrate by electricity, the power supply system including:
    a wireless electricity receiver configured for connecting to the vibrator, the wireless electricity receiver having a receiver resonance frequency which is identical to the resonance frequency of the vibrator,
    a wireless electricity transmitter including a transmitter, a frequency converter, and
    a controller, the transmitter being configured for transmitting electricity to the wireless electricity receiver, the transmitter having a transmitter resonance frequency, the frequency converter being connected to the transmitter and being triggered by electricity to output an operating voltage to the transmitter, the operating voltage having an oscillation frequency, an operating current being generated when the operating voltage is exerted on the transmitter, the controller being connected to the frequency converter, the controller controlling and adjusting the oscillation frequency according to a phase of the operating voltage and a phase of the operating current.

2. The power supply system of claim 1, wherein the transmitter resonance frequency is identical to the receiver resonance frequency.

3. The power supply system of claim 1, wherein a phase difference between the operating voltage and the operating current is monitored by the controller, the oscillation frequency is maintained by the controller if the phase difference is a predetermined value, the oscillation frequency is changed by the controller if the phase difference is not the predetermined value in order to make the phase difference approach the predetermined value.

4. The power supply system of claim 1, wherein a phase difference between the operating voltage and the operating current is monitored by the controller, the oscillation frequency is maintained by the controller if the phase difference is zero, the oscillation frequency is changed by the controller if the phase difference is not zero in order to minimize the phase difference.

5. The power supply system of claim 1, wherein the frequency converter is a half bridge inverter.

6. The power supply system of claim 1, further including a DC-to-DC converter, the DC-to-DC converter being connected to the frequency converter to be driven by electricity to output a driving voltage to the frequency converter, the controller being connected to the DC-to-DC converter to alternate the driving voltage.

7. A vibrating processing apparatus, including: the power supply system of claim 1, wherein the wireless electricity receiver being connected to the vibrator; the power supply system further including a processing tool, wherein the vibrator being disposed on the processing tool, the vibrator being electrically triggered by the wireless electricity receiver in order to make at least a part of the processing tool vibrate.

8. The vibrating processing apparatus of claim 7, wherein the vibrator is a piezoelectric element.

9. The vibrating processing apparatus of claim 7, wherein a capacitance of the transmitter is defined as C1, an inductance of the transmitter is defined as L1, a capacitance of the wireless electricity receiver is defined as C2, an inductance of the wireless electricity receiver is defined as L2, the resonance frequency of the vibrator is defined as fr, and $$f_r = \frac{1}{2\pi\sqrt{L_1 C_1}} = \frac{1}{2\pi\sqrt{L_2 C_2}}.$$

10. The vibrating processing apparatus of claim 7, wherein the transmitter resonance frequency is identical to the receiver resonance frequency.

11. The vibrating processing apparatus of claim 7, wherein a phase difference between the operating voltage and the operating current is monitored by the controller, the oscillation frequency is maintained by the controller if the phase difference is a predetermined value, the oscillation frequency is changed by the controller if the phase difference is not the predetermined value in order to make the phase difference approach the predetermined value.

12. The vibrating processing apparatus of claim 7, wherein a phase difference between the operating voltage and the operating current is monitored by the controller, the oscillation frequency is maintained by the controller if the phase difference is zero, the oscillation frequency is changed by the controller if the phase difference is not zero in order to minimize the phase difference.

13. The vibrating processing apparatus of claim 7, wherein the frequency converter is a half bridge inverter.

14. The vibrating processing apparatus of claim 7, wherein the power supply system further includes a DC-to-DC converter, the DC-to-DC converter is connected to the frequency converter to be driven by electricity to output a driving voltage to the frequency converter, the controller is connected to the DC-to-DC converter to alternate the driving voltage.

* * * * *